United States Patent
Nanao et al.

(10) Patent No.: US 10,944,040 B2
(45) Date of Patent: Mar. 9, 2021

(54) PIEZOELECTRIC THIN FILM-STACKED BODY, PIEZOELECTRIC THIN FILM SUBSTRATE, PIEZOELECTRIC THIN FILM DEVICE, PIEZOELECTRIC ACTUATOR, PIEZOELECTRIC SENSOR, HEAD ASSEMBLY, HEAD STACK ASSEMBLY, HARD DISK DRIVE, PRINTER HEAD, AND INK-JET PRINTER DEVICE

(71) Applicant: TDK CORPORATION, Tokyo (JP)

(72) Inventors: Masaru Nanao, Tokyo (JP); Kouhei Ohhashi, Tokyo (JP); Kenta Ishii, Tokyo (JP)

(73) Assignee: TDK CORPORATION, Tokyo (JP)

( * ) Notice: Subject to any disclaimer, the term of this patent is extended or adjusted under 35 U.S.C. 154(b) by 524 days.

(21) Appl. No.: 15/830,646

(22) Filed: Dec. 4, 2017

(65) Prior Publication Data

US 2018/0159019 A1 Jun. 7, 2018

(30) Foreign Application Priority Data

Dec. 7, 2016 (JP) .............. JP2016-237727

(51) Int. Cl.
*H01L 41/08* (2006.01)
*H01L 41/187* (2006.01)
(Continued)

(52) U.S. Cl.
CPC ...... *H01L 41/0815* (2013.01); *B41J 2/14201* (2013.01); *B41J 2/14233* (2013.01); *H01L 41/0477* (2013.01); *H01L 41/0973* (2013.01); *H01L 41/1132* (2013.01); *H01L 41/1873* (2013.01); *B41J 2202/03* (2013.01);
(Continued)

(58) Field of Classification Search
CPC .............. H01L 41/0805; H01L 41/0815; B41J 2002/14258; B41J 2/14201
See application file for complete search history.

(56) References Cited

U.S. PATENT DOCUMENTS 6,347,862 B1   2/2002  Kanno et al.
2009/0026887 A1  1/2009 Fujii et al.
(Continued)

FOREIGN PATENT DOCUMENTS

CN  102959752 A   3/2013
CN  104395087 A   3/2015
(Continued)

OTHER PUBLICATIONS

Yamadera, Hideya, "Measurement and Control of Thermal Stress in Thin Films," R&D Review of Toyota CRDL, vol. 34, No. 1, pp. 19-24, Mar. 1999.

*Primary Examiner* — J. San Martin
(74) *Attorney, Agent, or Firm* — Oliff PLC

(57) ABSTRACT

A piezoelectric thin film-stacked body is provided. A piezoelectric thin film-stacked body has a first electrode layer, a first intermediate layer stacked on the first electrode layer, a second intermediate layer stacked on the first intermediate layer, and a piezoelectric thin film stacked on the second intermediate layer, the first intermediate layer includes K, Na, and Nb, the second intermediate layer is a layer causing stress in a compression direction in the piezoelectric thin film, and the piezoelectric thin film includes $(K,Na)NbO_3$.

16 Claims, 10 Drawing Sheets

(51) Int. Cl.
  *B41J 2/14*    (2006.01)
  *H01L 41/09*   (2006.01)
  *H01L 41/047*  (2006.01)
  *H01L 41/113*  (2006.01)
  *H01L 41/22*   (2013.01)
  *G11B 5/48*    (2006.01)

(52) U.S. Cl.
  CPC ............ *G11B 5/483* (2015.09); *G11B 5/4873* (2013.01); *H01L 41/22* (2013.01)

(56) References Cited

U.S. PATENT DOCUMENTS

| | | |
|---|---|---|
| 2009/0075066 A1 | 3/2009 | Shibata et al. |
| 2013/0127293 A1* | 5/2013 | Ikeuchi ............... H01L 41/1873 310/311 |
| 2014/0035439 A1 | 2/2014 | Kurachi et al. |
| 2014/0049138 A1* | 2/2014 | Shiraki ............... C23C 18/1216 310/330 |
| 2014/0339961 A1* | 11/2014 | Maejima ................ G11B 5/483 310/358 |
| 2016/0284969 A1 | 9/2016 | Sumi et al. |

FOREIGN PATENT DOCUMENTS

| | | |
|---|---|---|
| CN | 106025059 A | 10/2016 |
| JP | H10-286953 A | 10/1998 |
| JP | 2007-19302 A | 1/2007 |
| JP | 2007-287918 A | 11/2007 |
| JP | 2009-094449 A | 4/2009 |
| JP | 2009-130182 A | 6/2009 |
| JP | 2015-529963 A | 10/2015 |

* cited by examiner

PIEZOELECTRIC THIN FILM-STACKED BODY, PIEZOELECTRIC THIN FILM SUBSTRATE, PIEZOELECTRIC THIN FILM DEVICE, PIEZOELECTRIC ACTUATOR, PIEZOELECTRIC SENSOR, HEAD ASSEMBLY, HEAD STACK ASSEMBLY, HARD DISK DRIVE, PRINTER HEAD, AND INK-JET PRINTER DEVICE

TECHNICAL FIELD

The present invention relates to a piezoelectric thin film-stacked body, a piezoelectric thin film substrate, a piezoelectric thin film device, a piezoelectric actuator, a piezoelectric sensor, a head assembly, a head stack assembly, a hard disk drive, a printer head, and an ink-jet printer device.

BACKGROUND

At present, piezoelectric thin film devices in which piezoelectric compositions are utilized are used in many fields. In a piezoelectric thin film device in which a positive piezoelectric effect is utilized, when stress is applied to a piezoelectric composition and the piezoelectric composition is strained, voltage proportional to the amount of strain of the piezoelectric composition occurs. Piezoelectric thin film devices in which a positive piezoelectric effect is utilized are, for example, a gyro sensor, a pressure sensor, a pulse wave sensor, a shock sensor, a microphone, and the like. Meanwhile, in a piezoelectric device in which an inverse piezoelectric effect is utilized, when voltage is applied to a piezoelectric composition, a mechanical strain proportional to the magnitude of the voltage occurs in the piezoelectric composition. Piezoelectric thin film devices in which an inverse piezoelectric effect is utilized are, for example, an actuator, a hard disk drive head slider, an ink-jet print head, a speaker, a buzzer, a resonator, and the like.

Electronic components such as piezoelectric thin film devices are required to be unlikely to change the characteristics due to temperature. When changes in the characteristics due to temperature are great and the temperature of electronic components changes, desired characteristics cannot be obtained. In order to correct the changes in the characteristics of the electronic components, it becomes necessary to add control circuits to devices, and the manufacturing costs of the devices become high.

Since electronic components become increasingly miniaturized and sophisticated, piezoelectric thin film devices are also required to become miniaturized and sophisticated. However, when a bulk material (piezoelectric composition) produced by a general solid phase synthesis method is fabricated thin, as the bulk material becomes fabricated thinner, the thickness of the bulk material approaches the particle diameters of particles constituting the bulk material. Consequently, adverse effects such as the occurrence of characteristic defects cannot be neglected. Therefore, the research and development of piezoelectric thin film manufacturing techniques in which vapor deposition represented by a sputtering method is used have been conducted eagerly in recent years. The fabrication of piezoelectric thin film devices thinner is expected to improve the performance of the piezoelectric thin film devices. For example, making piezoelectric thin film devices thinner enables the highly precise control of amounts of displacement or improves the sensing sensitivity. Many piezoelectric thin film devices can be collectively manufactured on substrates by making the piezoelectric thin film devices thinner and miniaturizing them. Consequently, the mass productivity of piezoelectric thin film devices is improved, and mass production cost is reduced.

Lead zirconate titanate (PZT: $Pb(Zr,Ti)O_3$), which is a perovskite-type oxide, has been used as a typical piezoelectric composition until now. For example, piezoelectric thin film devices that meet various needs have been broadly developed by adding various accessory ingredients or additives to PZT similarly to a piezoelectric thin film device described in Japanese Unexamined Patent Publication No. H10-286953.

However, lead, which pollutes the environment, leaches out of PZT when it is exposed to acid rain. Therefore, the abandonment of lead is desired in view of the environment, and the development of unleaded (lead-free) piezoelectric compositions is an important task.

Potassium sodium niobate (KNN: $(K,Na)NbO_3$) and the like are disclosed as an unleaded piezoelectric composition in Japanese Unexamined Patent Publication No. 2007-19302. KNN has a comparatively high Curie point ($T_C$) among piezoelectric compositions, and good piezoelectric characteristics are expected to be obtained.

Technique for improving the characteristics of a piezoelectric thin film device by providing an intermediate film that causes stress in a compression direction in a piezoelectric thin film between an electrode layer and the piezoelectric thin film is disclosed in Japanese Unexamined Patent Publication No. 2009-94449 and U.S. Unexamined Patent Application Publication No. 2014/0035439.

SUMMARY

Problem to be Solved by the Invention

However, the amounts of displacement of conventional piezoelectric thin film devices using KNN were not large enough. The amounts of displacement of conventional piezoelectric thin film devices fluctuated easily with temperature changes, and the operation of piezoelectric thin film devices was not stable.

The present invention has been completed in light of the above-mentioned circumstances, and an object thereof is to provide a piezoelectric thin film-stacked body the amounts of displacement of which are large and unlikely to depend on temperature, a piezoelectric thin film substrate, and a piezoelectric thin film device as well as a piezoelectric actuator using the piezoelectric thin film device, a piezoelectric sensor, a head assembly, a head stack assembly, a hard disk drive, a printer head, and an ink-jet printer device.

Means for Solving the Problem

A piezoelectric thin film-stacked body according to one aspect of the present invention comprises: a first electrode layer; a first intermediate layer stacked on the first electrode layer; a second intermediate layer stacked on the first intermediate layer, and a piezoelectric thin film stacked on the second intermediate layer, the first intermediate layer includes K, Na, and Nb, the second intermediate layer is a layer causing stress in a compression direction in the piezoelectric thin film, and the piezoelectric thin film includes $(K,Na)NbO_3$.

In the above-mentioned piezoelectric thin film-stacked body according to one aspect of the present invention, the second intermediate layer may include an inorganic oxide.

In the above-mentioned piezoelectric thin film-stacked body according to one aspect of the present invention, the second intermediate layer may include a perovskite-type inorganic oxide.

In the above-mentioned piezoelectric thin film-stacked body according to one aspect of the present invention, the second intermediate layer may include at least one perovskite-type inorganic oxide selected from the group consisting of $SrRuO_3$, $CaRuO_3$, $BaRuO_3$, and $LaNiO_3$.

A piezoelectric thin film substrate according to one aspect of the present invention includes the above-mentioned piezoelectric thin film-stacked body and a substrate, and the first electrode layer is located between the substrate and the first intermediate layer.

A piezoelectric thin film device according to one aspect of the present invention includes the above-mentioned piezoelectric thin film-stacked body and a second electrode layer, and the first intermediate layer, the second intermediate layer, and the piezoelectric thin film are located between the first electrode layer and the second electrode layer.

A piezoelectric actuator according to one aspect of the present invention comprises the above-mentioned piezoelectric thin film device.

A piezoelectric sensor according to one aspect of the present invention comprises the above-mentioned piezoelectric thin film device.

A head assembly according to one aspect of the present invention comprises the above-mentioned piezoelectric actuator.

A head stack assembly according to one aspect of the present invention comprises the above-mentioned head assembly.

A hard disk drive according to one aspect of the present invention comprises the above-mentioned head stack assembly.

A printer head according to one aspect of the present invention comprises the above-mentioned piezoelectric actuator.

An ink-jet printer device according to one aspect of the present invention comprises the above-mentioned printer head.

Effects of the Invention

The present invention provides a piezoelectric thin film-stacked body, the amounts of displacement of which are large and unlikely to depend on temperature, a piezoelectric thin film substrate, a piezoelectric thin film device as well as a piezoelectric actuator using the piezoelectric thin film device, a piezoelectric sensor, a head assembly, a head stack assembly, a hard disk drive, a printer head, and an ink-jet printer device.

DETAILED DESCRIPTION

Figure 1A:
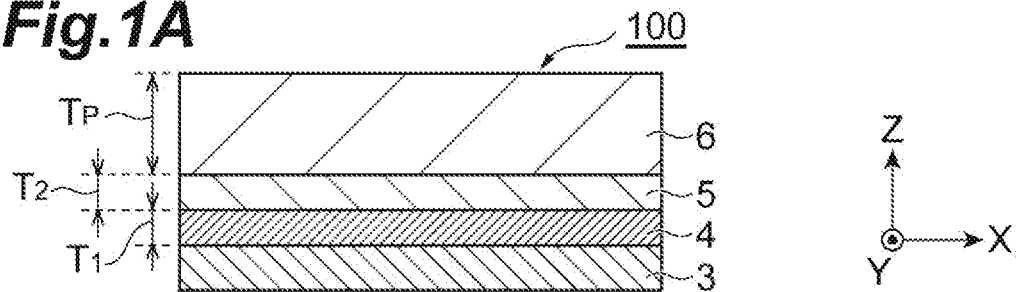
FIG. 1A is a schematic view of a piezoelectric thin film-stacked body according to one embodiment of the present invention (a sectional view of the piezoelectric thin film-stacked body in the stacking direction)

One preferred embodiment of the present invention will be described in detail hereinafter with reference to the drawings. In the drawings, identical or equivalent components are marked with the same reference sign. X, Y, and Z illustrated in FIGS. 1A, 1B, 1C, 1D, and 10 mean three coordinate axes at right angles to one another. When a description overlaps, the description is omitted. The present invention is not limited to the following embodiments.

(Piezoelectric Thin Film-Stacked Body, Piezoelectric Thin Film Substrate, and Piezoelectric Thin Film Device)

As illustrated in FIG. 1A, a piezoelectric thin film-stacked body 100 according to this embodiment comprises a first electrode layer 3, a first intermediate layer 4 stacked on the surface of the first electrode layer 3, a second intermediate layer 5 stacked on the surface of the first intermediate layer 4, and a piezoelectric thin film 6 stacked on the surface of the second intermediate layer 5. That is, part or all of the first intermediate layer 4 overlaps the surface of the first electrode layer 3, part or all of the second intermediate layer 5 overlaps the surface of the first intermediate layer 4, and part or all of the piezoelectric thin film 6 overlaps the surface of the second intermediate layer 5. The first intermediate layer 4 includes K, Na, and Nb. The second intermediate layer 5 is a layer which causes stress in a compression direction in the piezoelectric thin film 6. Here, a compression direction may be called a direction (X direction) parallel to the surface of the piezoelectric thin film 6. The compression direction is also called a direction perpendicular to the thickness direction (stacking direction, Z direction) of the piezoelectric thin film 6. The piezoelectric thin film 6 includes $(K,Na)NbO_3$.

Figure 1B:
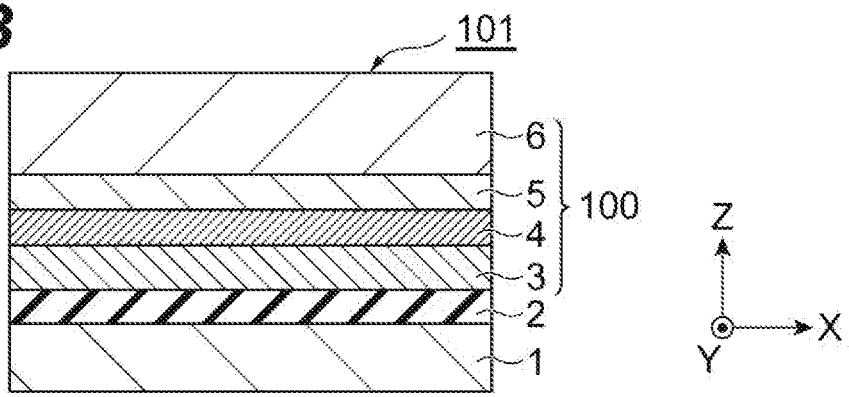
FIG. 1B is a schematic view of a piezoelectric thin film substrate according to one embodiment of the present invention (a sectional view of the piezoelectric thin film substrate in the stacking direction)

As illustrated in FIG. 1B, a piezoelectric thin film substrate 101 according to this embodiment includes a substrate 1, an insulating layer 2, and the above-mentioned piezoelectric thin film-stacked body 100. The first electrode layer 3 is located between the substrate 1 and the first intermediate layer 4. The insulating layer 2 is stacked on the surface of the substrate 1. The first electrode layer 3 is stacked on the surface of the insulating layer 2. Part or all of the insulating layer 2 may overlap the surface of the substrate 1. Part or all of the first electrode layer 3 may overlap the surface of the insulating layer 2. The piezoelectric thin film substrate 101 may not comprise the insulating layer 2. When there is no insulating layer 2, the substrate 1 may be in contact with the surface of the first electrode layer 3. The piezoelectric thin film substrate 101 may not be divided to be individual pieces (for example, a wafer). The piezoelectric thin film substrate 101 may be divided into individual pieces (for example, chips).

Figure 1C:
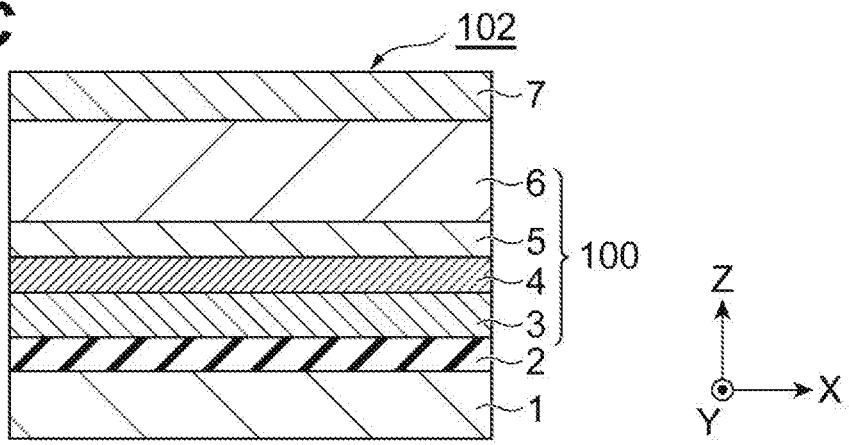
FIG. 1C is a schematic view of a piezoelectric thin film device according to one embodiment of the present invention (a sectional view of the piezoelectric thin film device in the stacking direction)

As illustrated in FIG. 1C, a piezoelectric thin film device 102 according to this embodiment includes the substrate 1, the insulating layer 2, the above-mentioned piezoelectric thin film-stacked body 100, and a second electrode layer 7. In other words, the piezoelectric thin film device 102 includes the above-mentioned piezoelectric thin film substrate 101 and the second electrode layer 7. The first intermediate layer 4, the second intermediate layer 5, and the piezoelectric thin film 6 are located between the first electrode layer 3 and the second electrode layer 7. The second electrode layer 7 is stacked on the surface of the piezoelectric thin film 6. Part or all of the second electrode layer 7 may overlap the surface of the piezoelectric thin film 6. The piezoelectric thin film device 102 may not comprise the substrate 1. The piezoelectric thin film device 102 may not comprise the insulating layer 2.

Figure 1D:
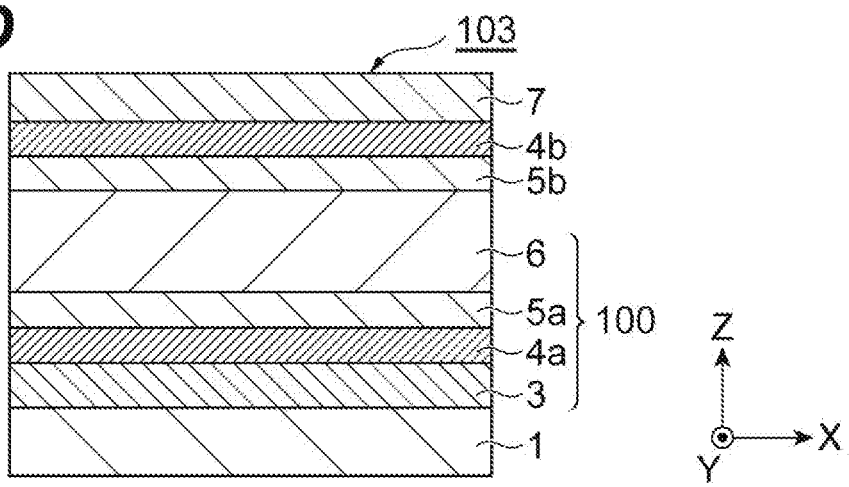
FIG. 1D is a schematic view of a piezoelectric thin film device according to one embodiment of the present invention (a sectional view of the piezoelectric thin film device in the stacking direction).

As illustrated in FIG. 1D, a piezoelectric thin film device 103, which is a variation of the piezoelectric thin film device 102, includes the substrate 1, the above-mentioned piezoelectric thin film-stacked body 100, a different second intermediate layer 5b from a second intermediate layer 5a that the piezoelectric thin film-stacked body 100 includes, a different intermediate layer 4b from a first intermediate layer 4a that the piezoelectric thin film-stacked body 100 comprises, and the second electrode layer 7. The different second intermediate layer 5b is stacked on the surface of the piezoelectric thin film 6. The different first intermediate layer 4b is stacked on the surface of the different second intermediate layer 5b. The second electrode layer 7 is stacked on the surface of the different first intermediate layer 4b. Part or all of the different second intermediate layer 5b may overlap the surface of the piezoelectric thin film 6. Part or all of the different first intermediate layer 4b may overlap the surface of the different second intermediate layer 5b. Part or all of the second electrode layer 7 may overlap the surface of the different first intermediate layer 4b. The piezoelectric thin film device 103 may not comprise the substrate 1. The piezoelectric thin film device 103 may comprise the insulating layer 2.

The amount of displacement of the piezoelectric thin film-stacked body 100 is larger than the amounts of displacement of conventional piezoelectric thin film-stacked bodies using KNN. The amount of displacement of the piezoelectric thin film-stacked body 100 is less likely to depend on temperature than the amounts of displacement of conventional piezoelectric thin film-stacked bodies using KNN. The amount of displacement of the piezoelectric thin film substrate 101 is larger than the amounts of displacement of conventional piezoelectric thin film substrates using KNN. The amount of displacement of the piezoelectric thin film substrate 101 is less likely to depend on temperature than the amounts of displacement of conventional piezoelectric thin film substrates using KNN. The amounts of displacement of the piezoelectric thin film devices 102 and 103 are larger than the amounts of displacement of conventional piezoelectric thin film devices using KNN. The amounts of displacement of the piezoelectric thin film devices 102 and 103 are less likely to depend on temperature than the amounts of displacement of conventional piezoelectric thin film devices using KNN.

The present inventors consider that the reasons why the amount of displacement of the piezoelectric thin film-stacked body 100 is large and the amount of displacement of the piezoelectric thin film-stacked body 100 is unlikely to depend on temperature are as follows. Since the piezoelectric thin film-stacked body 100 comprises the second intermediate layer 5, stress in a compression direction occurs in the piezoelectric thin film 6. Consequently, since the orientation axis in a thickness direction (Z direction) of the piezoelectric thin film 6 is stabilized, fluctuations in the amount of displacement with temperature changes are suppressed and the amount of displacement also becomes large. However, the amount of displacement does not become large enough when there is only the second intermediate layer 5. However, influence due to the difference between the second intermediate layer 5 and the piezoelectric thin film 6 in the crystal structure or the crystal orientation is reduced since the first intermediate layer 4 including K, Na, and Nb that are the same as elements contained in the piezoelectric thin film 6 is provided. Consequently, as the amount of displacement becomes still larger, fluctuations in the amount of displacement with temperature changes is further suppressed. The reasons why the amount of displacement of the piezoelectric thin film-stacked body 100 is large and the amount of displacement of the piezoelectric thin film-stacked body 100 is unlikely to depend on temperature are not limited to the above-mentioned reasons.

The substrate 1 may be, for example, a silicon substrate (for example, a single crystal silicon substrate), an SOI (Silicon on Insulator) substrate, a quartz glass substrate, a compound semiconductor substrate consisting of GaAs or the like, a sapphire substrate, a metallic substrate consisting of stainless steel or the like, a MgO substrate, a $SrTiO_3$ substrate, or the like. A silicon substrate is preferable as the substrate 1 in view of a low cost and ease of handling. When the substrate 1 is a silicon substrate, the plane direction of the surface of the substrate 1 with which the insulating layer 2 or the first electrode layer 3 overlaps may be (100), and may be a plane direction different from (100). The thickness of the substrate 1 may be, for example, 10 to 1000 μm.

The insulating layer 2 insulates electrically between the substrate 1 and the first electrode layer 3. When the substrate 1 does not have conductivity, the piezoelectric thin film substrate 101 or the piezoelectric thin film device 102 may not comprise the insulating layer 2. When the substrate 1 has conductivity, the piezoelectric thin film device 103 may comprise the insulating layer 2. The insulating layer 2 may be, for example, the thermal oxide film of silicon ($SiO_2$), $Si_3N_4$, $ZrO_2$, $Y_2O_3$, ZnO, $Al_2O_3$, or the like. Methods for forming the insulating layer 2 may be a sputtering method, a vacuum deposition method, a thermal oxidation method, a printing method, a spin coating method, a sol-gel method, and the like. The thickness of the insulating layer 2 may be, for example, 10 to 1000 nm.

The first electrode layer 3 may consist of at least one metal selected from the group consisting of, for example, Pt (platinum), Pd (palladium), Rh (rhodium), Au (gold), Ru (ruthenium), Ir (iridium), Mo (molybdenum), Ti (titanium), Ta (tantalum), and Ni (nickel). The first electrode layer 3 may consist of, for example, a conductive metallic oxide such as $SrRuO_3$ (strontium ruthenate) or $LaNiO_3$ (lanthanum nickelate). The first electrode layer 3 may function as a substrate. When the first electrode layer 3 functions as a substrate, the piezoelectric thin film devices 102 and 103 may not comprise the substrate 1. The thickness of the first electrode layer 3 may be, for example, 20 to 1000 nm. When the thickness of the first electrode layer 3 is 20 nm or more, the function of the first electrode layer 3 becomes enough easily. When the thickness of the first electrode layer 3 is 1000 nm or less, the displacement characteristics of the piezoelectric thin film 6 are improved easily.

Methods for forming the first electrode layer 3 may be, for example, a sputtering method, a vacuum deposition method, a printing method, a spin coating method, a sol-gel method, and the like. When the first electrode layer 3 is formed by a sputtering method, the first electrode layer 3 may be formed in an Ar (argon) gas. The gas pressure may be 0.1 to 1.0 Pa. An applying power source may be a high-frequency power source or a direct-current power source. The output of an applying power source may be 0.5 to 1.0 W/cm². When the substrate 1 is a silicon substrate and the first electrode layer 3 is a Pt film, the Pt film is formed on a surface ((100) plane) of the silicon substrate heated at around 400 to 500° C. by a sputtering method.

The first intermediate layer 4 includes K, Na, and Nb. The first intermediate layer 4 may consist of an oxide including K, Na, and Nb. The first intermediate layer 4 may include other elements in addition to K, Na, and Nb. Other elements may be, for example, Li (lithium), Ba (barium), Sr (strontium), Ta (tantalum), Zr (zirconium), Mn (manganese), Sb (antimony), Ca (calcium), Cu (copper), and the like. When the first intermediate layer 4 includes other elements, the total of the content of K, Na, and Nb in the first intermediate layer 4 may be 80 mol % or more. In the piezoelectric thin film device 103, the composition of the first intermediate layer 4a may be the same as the composition of the different first intermediate layer 4b, and may be different from the composition of the different first intermediate layer 4b. The thickness $T_1$ of the first intermediate layer 4 may be, for example, 3 to 100 nm. The thickness of the first intermediate layer 4a may be the same as the thickness of the different first intermediate layer 4b, and may be different from the thickness of the different first intermediate layer 4b.

Methods for forming the first intermediate layer 4 may be, for example, a sputtering method. When the first intermediate layer 4 is formed by a sputtering method, the first intermediate layer 4 may be formed in a mixed gas of Ar and $O_2$ (oxygen). A sputtering target includes K, Na, and Nb. A sputtering target may include $(K,Na)NbO_3$. The same sputtering target as the sputtering target used for forming the piezoelectric thin film 6 may be used as a sputtering target. The molar ratio between K and Na in the sputtering target for the first intermediate layer 4 may be the same as the molar ratio between K and Na in the sputtering target for the piezoelectric thin film 6. The molar ratio between K and Na in the sputtering target for the first intermediate layer 4 may be different from the molar ratio between K and Na in the sputtering target for the piezoelectric thin film 6. An applying power source may be a high-frequency power source.

The second intermediate layer 5 causes stress in a compression direction in the piezoelectric thin film 6. The coefficient of linear expansion of the second intermediate layer 5 may be higher than the coefficient of linear expansion of the first electrode layer 3, and may be higher than the coefficient of linear expansion of the piezoelectric thin film 6. When the coefficient of linear expansion of the second intermediate layer 5 is higher than the coefficients of linear expansion of each of the first electrode layer 3 and the piezoelectric thin film 6, stress in a compression direction occurs easily in the piezoelectric thin film 6. The coefficient of linear expansion may be, for example, an average value of the rate of change of the length (thickness) per amount of temperature change of 1 K in the range of 20 to 500° C. The coefficient of linear expansion is determined, for example, by the following method. The length (thickness) $L_L$ (unit: m) of an object at the time when the object is at a temperature of $T_L K$ (for example, 293 K) is measured. A method for measuring the length (thickness) of the object may be, for example, an X-ray reflectance method. The temperature of the object is raised from $T_L K$ to $T_H K$ (for example, 773 K). The length (thickness) $L_H$ (unit: m) of the object at the time when the object is at a temperature of $T_H K$ is measured. On the basis of expression A, the coefficient of linear expansion α (unit: 1/K) is calculated from $L_H$ and $L_L$. The coefficient of linear expansion of the second intermediate layer 5 may be 0.1×10.6 (1/K) or more higher than the larger value of the coefficient of linear expansion of the first electrode layer 3 and the coefficient of linear expansion of the piezoelectric thin film 6. The coefficient of linear expansion of the second intermediate layer 5 may be, for example, $8.0 \times 10^{-6}$ to $20.0 \times 10^{-6}$ (1/K). The coefficient of linear expansion of the first electrode layer 3 may be, for example, $3.0 \times 10^{-6}$ to $15.0 \times 10^{-6}$ (1/K). The coefficient of linear expansion of the piezoelectric thin film 6 may be, for example, $3.0 \times 10^{-6}$ to $11.0 \times 10^{-6}$ (1/K). It is generally known that the coefficients of linear expansion of thin films are equal to the values of bulk materials or a little lower than the values of bulk materials (refer to "R&D review of Toyota CRDL," 1999, Vol. 34, No. 1, pp. 19-24). Therefore, when the composition of each of layers of a piezoelectric thin film device is known, the relationship among the coefficients of linear expansion of each of the layers in terms of magnitude can be presumed fully.

$$\alpha = \{(L_H - L_L)/L_L\} \times \{1/(T_H - T_L)\} \quad (A)$$

The second intermediate layer 5 may include an inorganic oxide. The second intermediate layer 5 may consist of only an inorganic oxide. When the second intermediate layer 5 includes an inorganic oxide, the coefficient of linear expansion of the second intermediate layer 5 becomes easily higher than the coefficient of linear expansion of the piezoelectric thin film 6. Stress in a compression direction is easily given to the piezoelectric thin film 6 by cooling after the second intermediate layer 5 is formed at a high temperature. An inorganic oxide included in the second intermediate layer 5 may include at least one selected from the group consisting of Ca, Ti, Cr, Mn, Co, Fe, Ni, Sr, Ru, La, Zn, In, Sn, Y, Ba, Cu, and Al. The second intermediate layer 5 may include a perovskite-type inorganic oxide. The second intermediate layer 5 may consist of only a perovskite-type inorganic oxide. When the second intermediate layer 5 includes a perovskite-type inorganic oxide, the piezoelectric thin film 6 also includes a perovskite-type inorganic oxide ($(K,Na)NbO_3$), and therefore, the influence due to the difference between the second intermediate layer 5 and the piezoelectric thin film 6 in the crystal structure and the crystal orientation is reduced. Consequently, the amount of displacement becomes larger easily and it is easy that the amount of displacement comes to be unlikely to depend on temperature. A perovskite-type inorganic oxide included in the second intermediate layer 5 may be, for example, $SrRuO_3$, $SrTiO_3$, $LaNiO_3$, $CaRuO_3$, $BaRuO_3$, $La_{0.5}Sr_{0.5}CoO_3$, $SrRu_{0.95}Mn_{0.05}O_3$, $LaAlO_3$, $YAlO_3$, and the like. The second intermediate layer 5 may include at least one perovskite-type inorganic oxide selected from the group consisting of $SrRuO_3$, $CaRuO_3$, $BaRuO_3$, and $LaNiO_3$. In this case, the amount of displacement becomes larger easily. The second intermediate layer 5 may also include an inorganic oxide which is not a perovskite-type. The second intermediate layer 5 may include, for example, $La_4BaCu_5O_{13}$, $YBa_2Cu_3O_7$, or the like as an inorganic oxide that is not a perovskite-type. In the piezoelectric thin film device 103, the composition of the second intermediate layer 5a may be the same as the composition of the different second intermediate layer 5b, and may be different from the composition of the different second intermediate layer 5b.

The thickness $T_2$ of the second intermediate layer 5 may be, for example, 5 to 100 nm. When $T_2$ is 5 nm or more, part of the second intermediate layer 5 is unlikely to be divided, and enough compressive stress is easily given to the piezoelectric thin film 6. When $T_2$ is 100 nm or less, the lattice constant of the second intermediate layer 5 is unlikely to change, and the crystallinity of the piezoelectric thin film 6 is easily improved. The thickness of the second intermediate layer 5a may be the same as the thickness of the different second intermediate layer 5b, and may be different from the thickness of the different second intermediate layer 5b.

Methods for forming the second intermediate layer 5 may be, for example, a sputtering method. When the second intermediate layer 5 is formed by a sputtering method, the second intermediate layer 5 may be formed in a mixed gas of Ar and $O_2$. A sputtering target may include the above-mentioned inorganic oxide. A sputtering target may include the above-mentioned perovskite-type inorganic oxide. An applying power source may be a high-frequency power source.

The piezoelectric thin film 6 includes perovskite-type $(K,Na)NbO_3$. $(K,Na)NbO_3$ may be called an oxide represented by chemical formula 1. The piezoelectric thin film 6 may consist of only $(K,Na)NbO_3$.

$$(K_{1-x}Na_x)NbO_3 \tag{1}$$

wherein $0<x<1$ in the above chemical formula 1.

The plane direction of the piezoelectric thin film 6 may be oriented preferentially in the thickness direction of the piezoelectric thin film 6. The plane direction oriented preferentially may be any plane direction selected from the group consisting of (001), (110), and (111).

The piezoelectric thin film 6 may further include other elements in addition to $(K,Na)NbO_3$. The other elements may be, for example, Li, Ba, Sr, Ta, Zr, Mn, Sb, Ca, Cu, and the like. At least part of the piezoelectric thin film 6 may be any of a crystal phase having a perovskite structure $(ABO_3)$, an amorphous phase, and a mixed phase in which the crystal phase and the amorphous phase are mixed. Here, the A-site of a perovskite structure may be at least one element selected from the group consisting of Li, Na, K, La, Sr, Ba, Ca, Nd, and Bi. The B-site of a perovskite structure may be at least one element selected from the group consisting of Zr, Ti, Mn, Mg, Nb, Sn, Sb, Ta, and In. When the piezoelectric thin film 6 includes other elements, the content of $(K,Na)NbO_3$ in the piezoelectric thin film 6 may be 80 mol % or more.

The thickness $T_p$ of the piezoelectric thin film 6 may be, for example, 0.2 to 5 μm.

Methods for forming the piezoelectric thin film 6 may be, for example, a sputtering method. When the piezoelectric thin film 6 is formed by a sputtering method, the piezoelectric thin film 6 may be formed in a mixed gas of Ar and $O_2$. The gas pressure may be 0.1 to 1.0 Pa. A sputtering target includes $(K,Na)NbO_3$. An applying power source may be a high-frequency power source. The output of an applying power source may be 2.5 to 5.5 $W/cm^2$.

The composition of the second electrode layer 7 may be the same as the composition of the first electrode layer 3. The thickness of the second electrode layer 7 may be, for example, 20 to 1000 nm. When the thickness of the second electrode layer 7 is 20 nm or more, the function of the second electrode layer 7 becomes enough easily. When the thickness of the second electrode layer 7 is 1000 nm or less, the displacement characteristics of the piezoelectric thin film 6 are improved easily. The second electrode layer 7 may be a stacked body of a plurality of metals and a conductive metallic oxide used as the above-mentioned first electrode layer 3.

Methods for forming the second electrode layer 7 may be, for example, a sputtering method, a vacuum deposition method, a printing method, a spin coating method, and a sol-gel method. When the second electrode layer 7 is formed by a sputtering method, the second electrode layer 7 may be formed in an Ar gas. The gas pressure may be 0.1 to 1.0 Pa. An applying power source may be a high-frequency power source or a direct-current power source. The output of an applying power source may be 0.5 to 1.0 $W/cm^2$.

The piezoelectric thin film devices 102 and 103 may be manufactured by the following procedure. First, a stacked body having the same stacked structure and composition as the piezoelectric thin film-stacked body 100 is formed on a wafer (uncut substrate 1). Then, the stacked body on the wafer is processed by methods such as photolithography, dry etching, and wet etching, and patterns having predetermined sizes are formed. The sizes of the patterns may be, for example, 15 mm×3 mm. A plurality of piezoelectric thin film devices 102 and 103, which are divided in to individual pieces, are obtained by cutting the wafer. The substrate 1 may be removed from the piezoelectric thin film devices 102 and 103. In this case, the amount of displacement of the piezoelectric thin film devices 102 and 103 becomes larger easily.

At least part or all of the surface of the piezoelectric thin film devices 102 and 103 may be coated with a protective film. For example, the reliability or the durability (for example, moisture resistance) of the piezoelectric thin film devices 102 and 103 is improved by coating with a protective film. The material of a protective film may be, for example, polyimide or the like.

The piezoelectric thin film devices 102 and 103 may further comprise at least either the input section or the output section for electric signals. In this case, the input or the output of electric signals is enabled, and at least either a positive piezoelectric effect or an inverse piezoelectric effect can be utilized.

The uses of the piezoelectric thin film-stacked body 100, the piezoelectric thin film substrate 101, and the piezoelectric thin film devices 102 and 103 are various. The piezoelectric thin film devices 102 and 103 may be used, for example, for a piezoelectric actuator. The piezoelectric actuator according to this embodiment is excellent in the displacement characteristic and the temperature characteristic. The piezoelectric actuator may be used, for example, for a head assembly, a head stack assembly, or a hard disk drive. The piezoelectric actuator may be used, for example, for a printer head or an ink-jet printer device. The piezoelectric thin film devices 102 and 103 may be used, for example, for a piezoelectric sensor. The piezoelectric sensor according to this embodiment is excellent in the displacement characteristic and the temperature characteristic of sensing sensitivity. The piezoelectric sensor may be, for example, a gyro sensor, a pressure sensor, a pulse wave sensor, or a shock sensor. The piezoelectric thin film devices 102 and 103 may be applied, for example, to a microphone.

Specific examples of the uses of the piezoelectric thin film-stacked body 100, the piezoelectric thin film substrate 101, and the piezoelectric thin film devices 102 and 103 are described in detail hereinafter.

(Piezoelectric Actuator)

Figure 2:
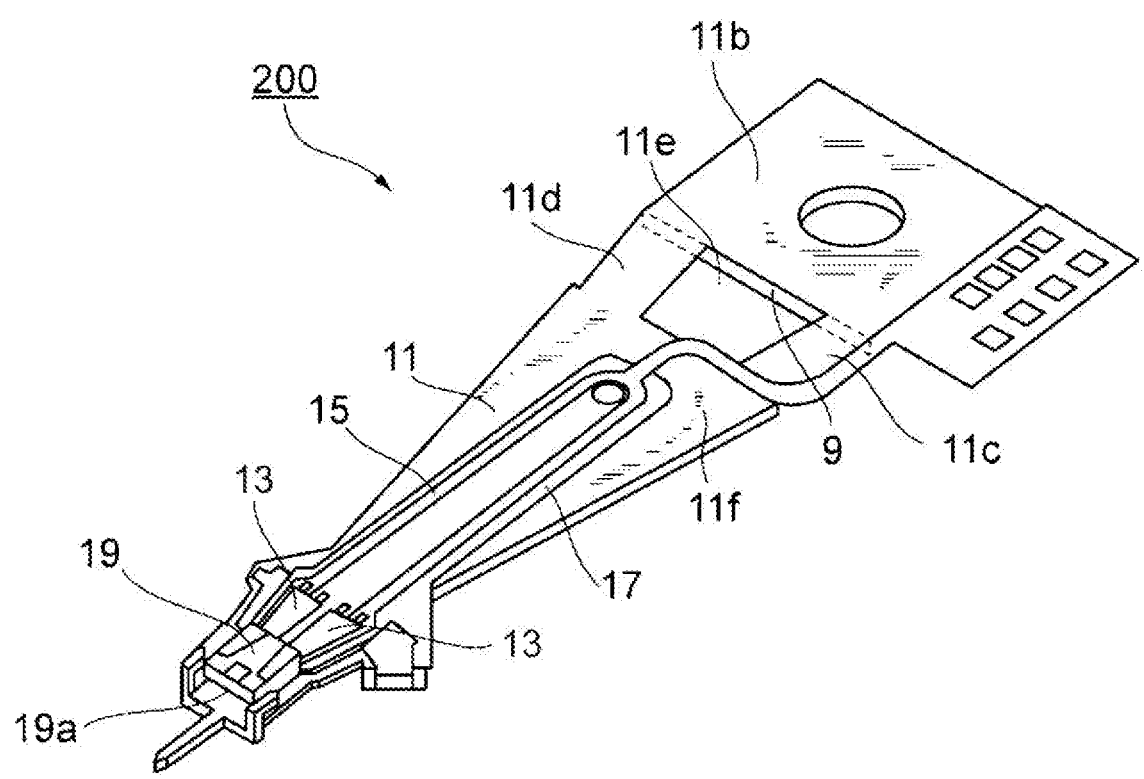
FIG. 2 is a schematic view of a head assembly according to one embodiment of the present invention.

FIG. 2 illustrates a head assembly 200 incorporated by a hard disk drive (HDD). The head assembly 200 comprises a base plate 9, a load beam 11, a flexure 17, first and second piezoelectric thin film devices 13, and a slider 19. The first and second piezoelectric thin film devices 13 are driver devices for the slider 19. The slider 19 has a head device 19a.

The load beam 11 comprises: a base end 11b adhered to the base plate 9; a first flat spring portion 11c and a second flat spring portion 11d extending from this base end 11b; an opening portion 11e formed between the flat spring portions 11c and 11d; and a beam main portion 11f connecting with the flat spring portions 11c and 11d and extending linearly. The first flat spring portion 11c and the second flat spring portion 11d are tapered off. The beam main portion 11f is also tapered off.

The first and second piezoelectric thin film devices 13 are disposed at a predetermined distance on a flexible substrate 15 for wiring, which is a part of the flexure 17. The slider 19 is fixed on the tip of the flexure 17, and is rotated with the expansion and contraction of the first and second piezoelectric thin film devices 13.

Figure 3:
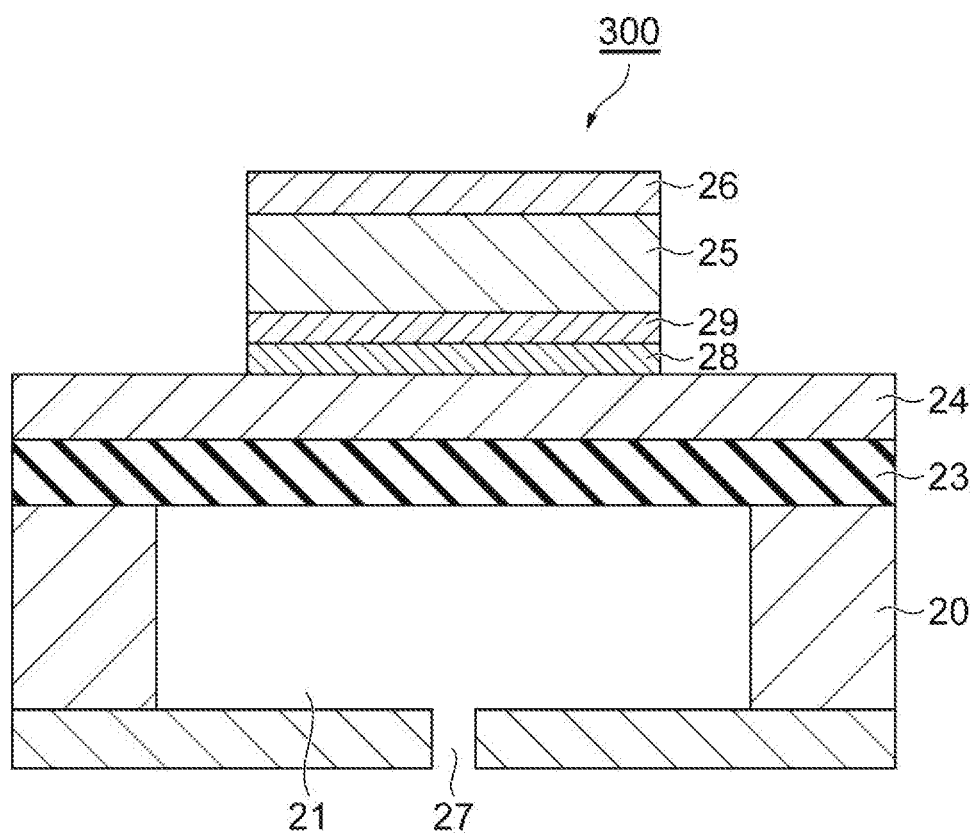
FIG. 3 is a schematic view of a piezoelectric actuator according to one embodiment of the present invention.

FIG. 3 illustrates a piezoelectric actuator 300 for a printer head. The piezoelectric actuator 300 is composed by stacking a base 20, an insulating film 23, a lower electrode layer 24 (first electrode layer), a first intermediate layer 28, a second intermediate layer 29, a piezoelectric thin film 25, and an upper electrode layer 26 (second electrode layer). The lower electrode layer may be called the above-mentioned first electrode layer. The upper electrode layer may be called the above-mentioned second electrode layer.

When predetermined ejection signals are not supplied and voltage is not applied between the lower electrode layer 24 and the upper electrode layer 26, the piezoelectric thin film 25 does not deform. A pressure change does not occur in a pressure chamber 21 that is adjacent to the piezoelectric thin film 25 to which ejection signals are not supplied, and ink droplets are not ejected from a nozzle 27.

Meanwhile, when predetermined ejection signals are supplied and a constant voltage is applied between the lower electrode layer 24 and the upper electrode layer 26, the piezoelectric thin film 25 deforms. Since the insulating film 23 bends greatly due to the deformation of the piezoelectric thin film 25, the pressure in the pressure chamber 21 increases momentarily, and an ink droplet is ejected from the nozzle 27.

(Piezoelectric Sensor)

Figure 4:
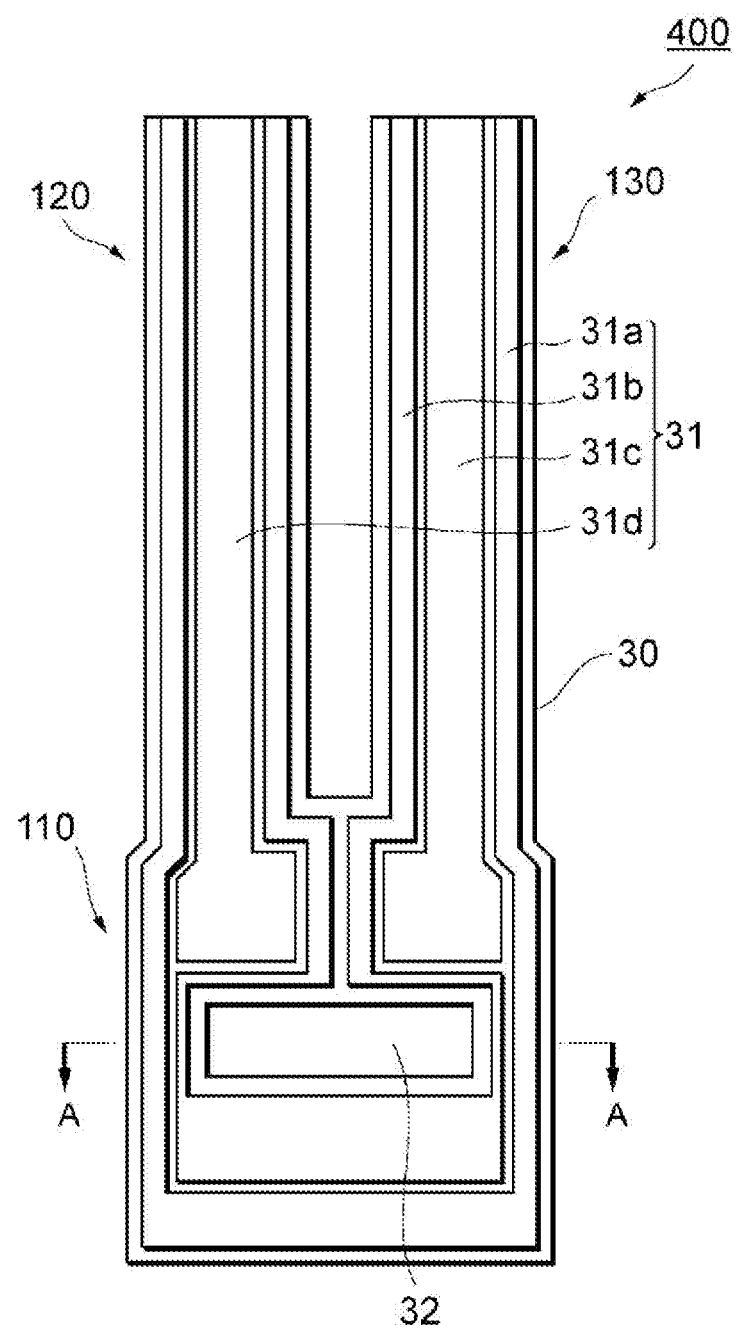
FIG. 4 is a schematic view (a top view) of a gyro sensor according to one embodiment of the present invention.
Figure 5:
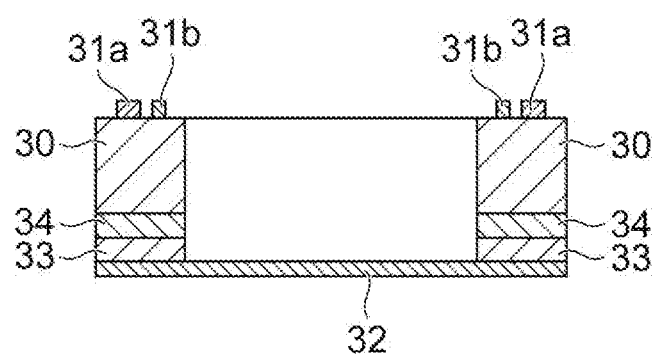
FIG. 5 is a cross section of the gyro sensor, taken from line A-A in FIG. 4.

FIG. 4 and FIG. 5 illustrate a gyro sensor 400, which is a type of piezoelectric sensor. The gyro sensor 400 comprises a basal portion 110 and a pair of arms 120 and 130 connected to a surface of the basal portion 110. The pair of arms 120 and 130 is a tuning fork oscillator. That is, the gyro sensor 400 is a tuning fork oscillator-type angular velocity detection device. This gyro sensor 400 is obtained by processing a piezoelectric thin film 30, an upper electrode layer 31 (second electrode layer), a lower electrode layer 32 (first electrode layer), a first intermediate layer 33, and a second intermediate layer 34 constituting the above-mentioned piezoelectric thin film device into the shape of a tuning fork type oscillator. The basal portion 110 and the arms 120 and 130 are integrated with the piezoelectric thin film device. The lower electrode layer may be called the above-mentioned first electrode layer. The upper electrode layer may be called the above-mentioned second electrode layer.

Driving electrode layers 31a and 31b and a sensing electrode layer 31d are formed on the first principal surface of one arm 120. Similarly, the driving electrode layers 31a and 31b and a sensing electrode layer 31c are formed on the first principal surface of the other arm 130. Each of the electrode layers 31a, 31b, 31c, and 31d are obtained by processing the upper electrode layer 31 into the shapes of predetermined electrodes by etching.

The lower electrode layer 32 is formed on the whole of the second principal surface (the rear face of the first principal surface) of each of the basal portion 110 and the arms 120 and 130 respectively. The lower electrode layer 32 functions as a ground electrode of the gyro sensor 400.

An XYZ rectangular coordinate system is defined by specifying that the longitudinal direction of each of the arms 120 and 130 is a Z direction and that a flat surface including the principal surface of the arms 120 and 130 is an XZ flat plane.

When driving signals are supplied to the driving electrode layers 31a and 31b, the two arms 120 and 130 are excited in an in-plane vibration mode. The in-plane vibration mode is a mode in which the two arms 120 and 130 are excited in a direction parallel to the principal surface of the two arms 120 and 130. For example, while one arm 120 is excited at a velocity V1 in a direction of −X, the other arm 130 is excited at a velocity V2 in a direction of +X.

When the rotation at an angular velocity ω having a Z axis as a rotational axis is applied to the gyro sensor 400, Coriolis force acts on each of the arms 120 and 130 in a direction perpendicular to the velocity direction. Consequently, the arms 120 and 130 begin to be excited in an out-of-plane vibration mode. The out-of-plane vibration mode is a mode in which the two arms 120 and 130 are excited in a direction perpendicular to the principal surface of the two arms 120 and 130. For example, when Coriolis force F1 acting on one arm 120 is in a direction of −Y, Coriolis force F2 acting on the other arm 130 is in a direction of +Y.

Since the magnitude of the Coriolis forces F1 and F2 is proportional to the angular velocity ω, the angular velocity ω is determined by converting the mechanical distortion of the arms 120 and 130 by the Coriolis forces F1 and F2 into electric signals (detection signals) by the piezoelectric thin film 30 and extracting the electric signals from the sensing electrode layers 31c and 31d.

Figure 6:
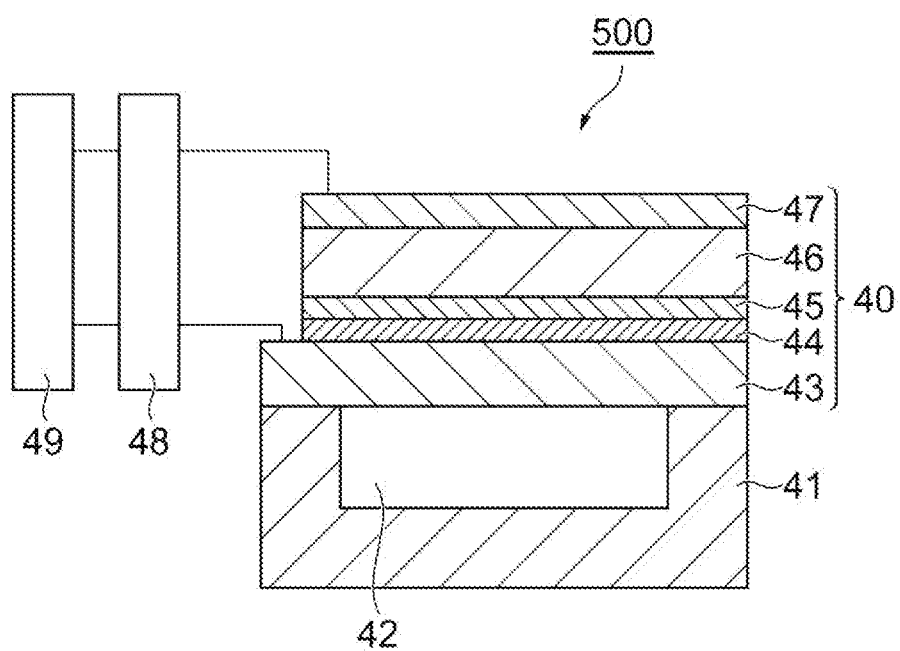
FIG. 6 is a schematic view of a pressure sensor according to one embodiment of the present invention.

FIG. 6 illustrates a pressure sensor 500, which is a type of piezoelectric sensor. The pressure sensor 500 is composed of a piezoelectric thin film device 40, a support 41 supporting the piezoelectric thin film device 40, a current amplifier 48, and a voltage-measuring device 49. The piezoelectric thin film device 40 is composed by stacking a common electrode layer 43 (first electrode layer), a first intermediate layer 44, a second intermediate layer 45, a piezoelectric thin film 46, and an individual electrode layer 47 (second electrode layer). The common electrode layer may be called the above-mentioned first electrode layer. The individual electrode layer may be called the above-mentioned second electrode layer. A cavity 42 surrounded by the common electrode layer 43 and the support 41 responds according to pressure. When external force is applied to the pressure sensor 500, the piezoelectric thin film device 40 bends and voltage is detected in the voltage-measuring device 49.

Figure 7:
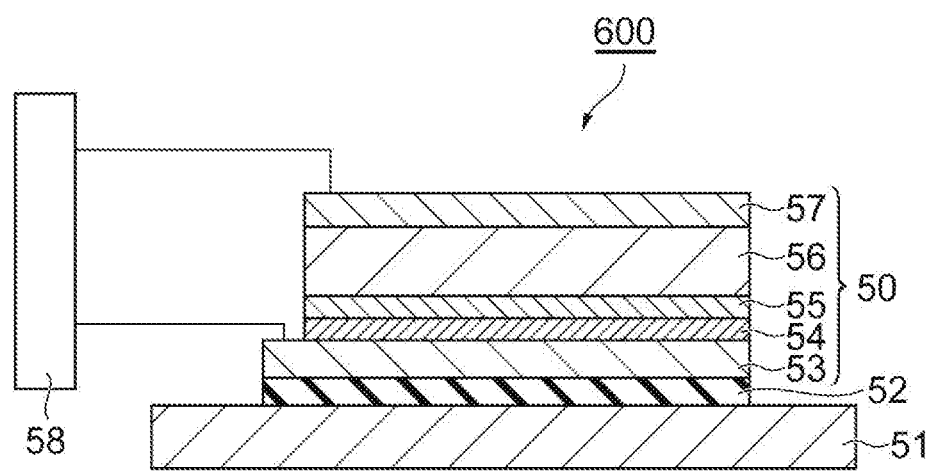
FIG. 7 is a schematic view of a pulse wave sensor according to one embodiment of the present invention.

FIG. 7 illustrates a pulse wave sensor 600, which is a type of piezoelectric sensor. The pulse wave sensor 600 is composed of a support 51, an insulating layer 52 overlapping the support 51, a piezoelectric thin film device 50 overlapping the insulating layer 52, and a voltage-measuring device 58. When the support 51 does not have conductivity, there may not be the insulating layer 52. The piezoelectric thin film device 50 is composed by stacking a common electrode layer 53 (first electrode layer), a first intermediate layer 54, a second intermediate layer 55, a piezoelectric thin film 56, and an individual electrode layer 57 (second electrode layer). The common electrode layer may be called the above-mentioned first electrode layer. The individual electrode layer may be called the above-mentioned second electrode layer. When the rear face (the face on which the piezoelectric thin film device 50 is not equipped) of the support 51 of the pulse wave sensor 600 is made to contact skin over arteries of a living body, the support 51 and the piezoelectric thin film device 50 are bent by the pressure due to pulses of the living body, and voltage is detected in the voltage-measuring device 58.

(Hard Disk Drive)

Figure 8:
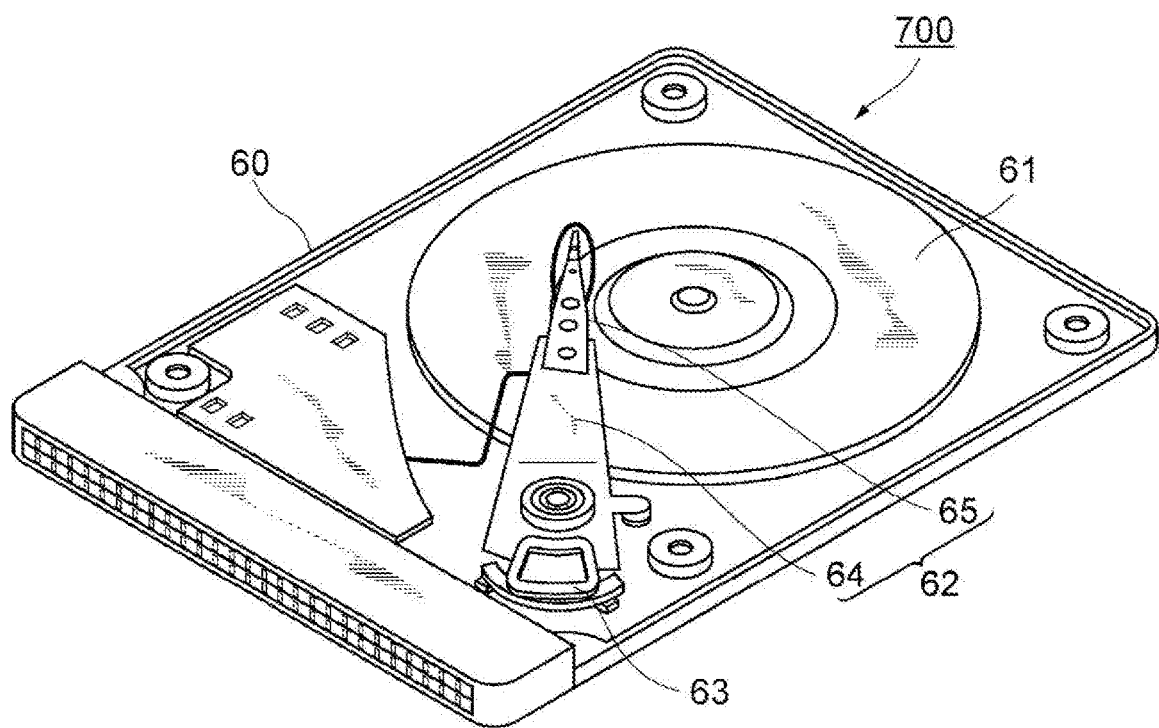
FIG. 8 is a schematic view of a hard disk drive according to one embodiment of the present invention.

FIG. 8 illustrates a hard disk drive 700 incorporating the head assembly illustrated in FIG. 2. A head assembly 65 in FIG. 8 is the same as the head assembly 200 in FIG. 2.

The hard disk drive 700 comprises a case 60, a hard disk 61 (recording medium) installed in the case 60, and a head stack assembly 62. The hard disk 61 is rotated by a motor. The head stack assembly 62 records magnetic information on the hard disk 61 or reproduces magnetic information recorded on the hard disk 61.

The head stack assembly 62 has a voice coil motor 63, an actuator arm 64 supported by a pivot, and the head assembly 65 connected to the actuator arm 64. The actuator arm 64 can rotate freely around the pivot by the voice coil motor 63. The actuator arm 64 is divided into a plurality of arms, and the head assembly 65 is connected to each of the arms respectively. That is, the plurality of arms and head assemblies 65 are stacked in a pivot direction. The slider 19 is attached to the tip of the head assembly 65 so as to be opposed to the hard disk 61.

The head assembly 65 (200) moves the head device 19a in two steps. The relatively larger movement of the head device 19a is controlled by the driving of the whole of the head assembly 65 and the actuator arm 64 by the voice coil motor 63. The micromovement of the head device 19a is controlled by the driving of the slider 19 located on the tip of the head assembly 65.

(Ink-Jet Printer Device)

Figure 9:
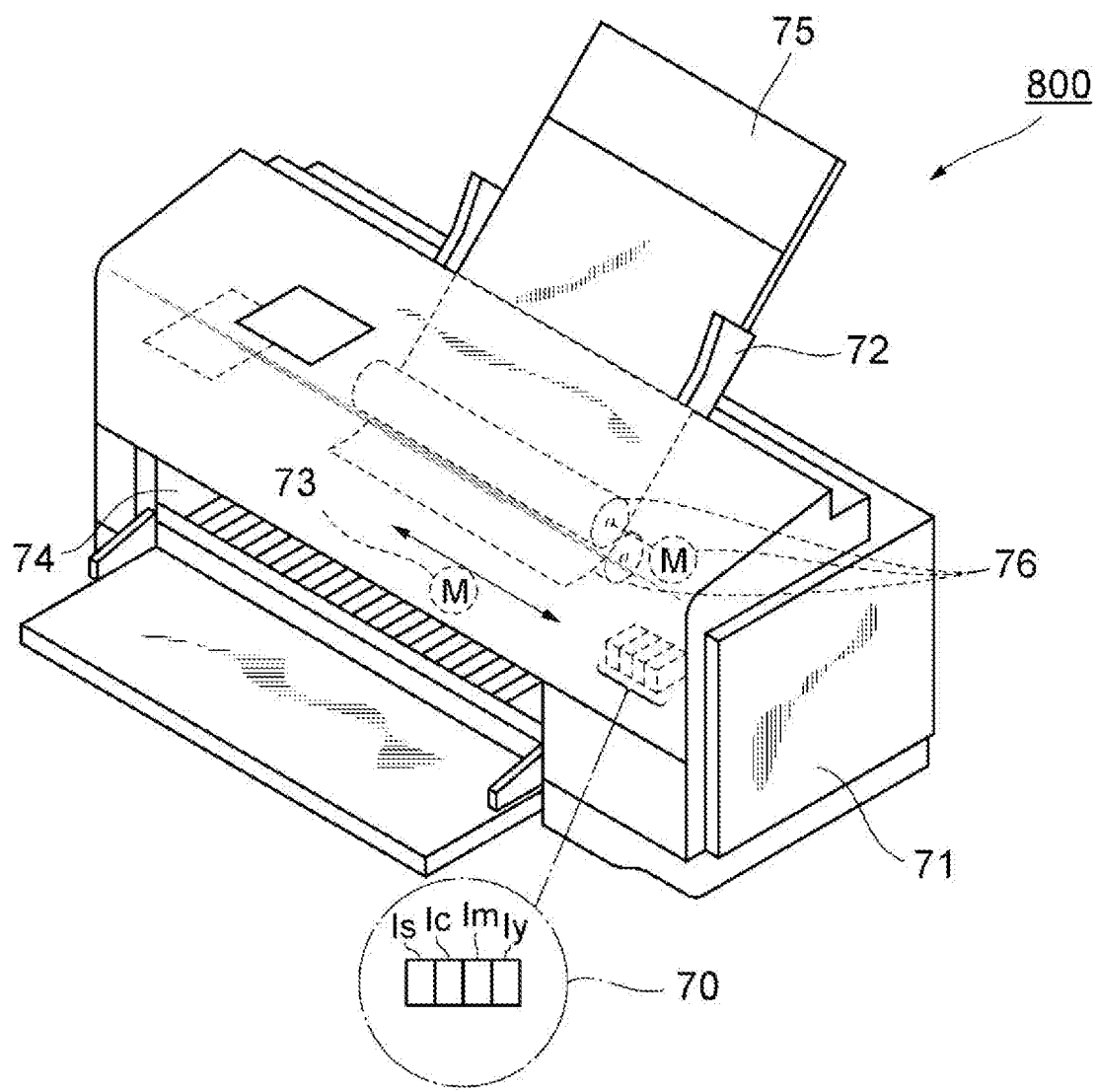
FIG. 9 is a schematic view of an ink-jet printer device according to one embodiment of the present invention.

FIG. 9 illustrates an ink-jet printer device 800. The ink-jet printer device 800 comprises a printer head 70, a main body 71, a tray 72, and a head drive mechanism 73. The printer head 70 in FIG. 9 has the piezoelectric actuator 300 in FIG. 3.

The ink-jet printer device 800 comprises ink cartridges of a total of the 4 colors of yellow, magenta, cyan, and black. Full color printing by the ink-jet printer device 800 is possible. A controller board for exclusive use and the like are incorporated inside the ink-jet printer device 800. The controller board and the like control the timing of the ejection of inks by the printer head 70 and the scanning of the head drive mechanism 73. The tray 72 is disposed on the rear of the main body 71, and an automatic sheet feeder (automatic continuous paper feed mechanism) 76 is disposed on the one end side of the tray 72. The automatic sheet feeder 76 sends out recording paper 75 automatically, and delivers the recording paper 75 from an output opening 74 on the front.

Although preferred embodiments of the present invention are described hereinbefore, the present invention is not limited to the above-mentioned embodiments necessarily. Various modifications of the present invention are possible, and these modifications are also included in the present invention as long as the modifications do not deviate from aims of the present invention.

EXAMPLES

Although the present invention will be described by Examples still more specifically hereinafter, the present invention is not limited to these Examples.

Example 1

A first electrode layer 3 consisting of Pt was formed on the surface of a silicon substrate (uncut substrate 1) in a vacuum chamber. The plane direction of the surface of the silicon substrate on which the first electrode layer 3 was formed was (100). The thickness of the silicon substrate was 400 μm. The first electrode layer 3 was formed by a sputtering method. The temperature of the silicon substrate in the process of formation of the first electrode layer 3 was maintained at 400° C. The thickness of the first electrode layer 3 was adjusted to 200 nm.

A first intermediate layer 4 including K, Na, Nb, and O was formed on the surface of the first electrode layer 3 in a vacuum chamber. The first intermediate layer 4 was formed by a sputtering method. The temperature of the silicon substrate in the process of forming the first intermediate layer 4 was maintained at 550° C. A mixed gas of Ar and $O_2$ was used as an atmosphere in the vacuum chamber. The concentration of $O_2$ in the mixed gas was 5% by volume on the basis of the total volume of the mixed gas. The gas pressure of the mixed gas was maintained at 0.2 Pa. $(K_{0.5}Na_{0.5})NbO_3$ was used as a sputtering target. The size of the sputtering target was φ 150 mm. A high-frequency power source was used as an applying power source of sputtering. The applied output was adjusted to 800 W. The thickness of the first intermediate layer 4 was adjusted to 50 nm.

A second intermediate layer 5 consisting of $SrRuO_3$ was formed on the surface of the first intermediate layer 4 in a vacuum chamber. The second intermediate layer 5 was formed by a sputtering method. The temperature of the silicon substrate in the process of forming the second intermediate layer 5 was maintained at 600° C. A mixed gas of Ar and $O_2$ was used as an atmosphere in the vacuum chamber. The concentration of $O_2$ in the mixed gas was 2.5% by volume on the basis of the total volume of the mixed gas. The gas pressure of the mixed gas was maintained at 0.2 Pa. The size of the sputtering target was φ 150 mm. A high-frequency power source was used as an applying power source of sputtering. The applied output was adjusted to 150 W. The thickness of the second intermediate layer 5 was adjusted to 15 nm.

A piezoelectric thin film 6 consisting of $(K,Na)NbO_3$ was formed on the surface of the second intermediate layer 5 in a vacuum chamber. The piezoelectric thin film 6 was formed by a sputtering method. The temperature of the silicon substrate in the process of forming the piezoelectric thin film 6 was maintained at 550° C. A mixed gas of Ar and $O_2$ was used as an atmosphere in the vacuum chamber. The concentration of 02 in the mixed gas was 5% by volume on the basis of the total volume of the mixed gas. $(K_{0.5}Na_{0.5})NbO_3$ was used as a sputtering target. The size of the sputtering target was φ 150 mm. A high-frequency power source was used as an applying power source for sputtering. The applied output was adjusted to 800 W. The thickness of the piezoelectric thin film 6 was adjusted to 2 μm. A piezoelectric thin film substrate 111 in Example 1 was obtained by the above method.

A second electrode layer 7 consisting of Pt was formed on the surface of the piezoelectric thin film 6 included in the piezoelectric thin film substrate 111 in a vacuum chamber.

The second electrode layer 7 was formed by a sputtering method. The temperature in the vacuum chamber was maintained at room temperature. The thickness of the second electrode layer 7 was adjusted to 200 nm.

The patterning of the second electrode layer 7, the piezoelectric thin film 6, the second intermediate layer 5, the first intermediate layer 4, and the first electrode layer 3 was performed by photolithography, dry etching, and wet etching. Then, the silicon substrate was cut. A piezoelectric thin film device 112 in Example 1 was obtained by the above method. The size of the movable portion of the piezoelectric thin film device 112 in Example 1 was 15 mm×3 mm.

[Measurement of Coefficient of Linear Expansion]

Each of samples for measuring coefficients of linear expansion were manufactured by the following method, and the respective coefficients of linear expansion of each of the first electrode layer 3, the second intermediate layer 5, and the piezoelectric thin film 6 in Example 1 were measured separately.

A first electrode layer 3 was formed directly on the surface of a silicon substrate by the same method as above. The patterning of the first electrode layer 3 was performed by the same method as above. The silicon substrate was cut to obtain samples. The sizes of the samples were 15 mm×3 mm. The coefficient of linear expansion of the first electrode layer 3 was measured by an X-ray reflectance method by using this sample. The coefficient of linear expansion of the first electrode layer 3 in Example 1 was $8.8 \times 10^{-6}$ (1/K).

A second intermediate layer 5 was formed directly on the surface of the silicon substrate by the same method as above. The patterning of the second intermediate layer 5 was performed by the same method as above. The silicon substrate was cut to obtain samples. The sizes of the samples were 15 mm×3 mm. The coefficient of linear expansion of the second intermediate layer 5 was measured by an X-ray reflectance method by using this sample. The coefficient of linear expansion of the second intermediate layer 5 in Example 1 is illustrated in Table 1.

A piezoelectric thin film 6 was formed directly on the surface of the silicon substrate by the same method as above. The patterning of the piezoelectric thin film 6 was performed by the same method as above. The silicon substrate was cut to obtain samples. The sizes of the samples were 15 mm×3 mm. The coefficient of linear expansion of the piezoelectric thin film 6 was measured by an X-ray reflectance method by using this sample. The coefficient of linear expansion of the piezoelectric thin film 6 in Example 1 was $8.0 \times 10^{-6}$ (1/K).

[Measurement of Amount of Displacement]

Figure 10:
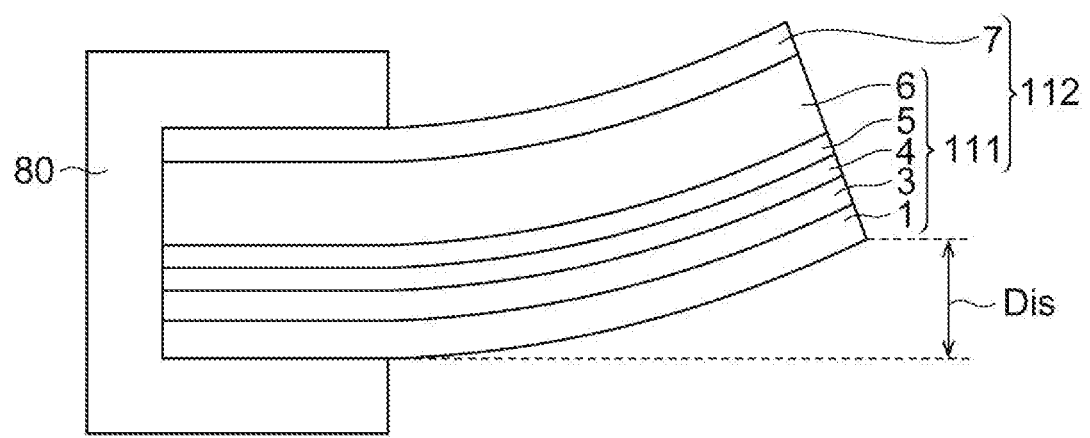
FIG. 10 is a schematic view illustrating a method for measuring the amount of displacement of a piezoelectric thin film device.
Figure 10:
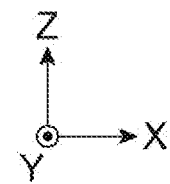

The amount of displacement $Dis_{25°C.}$ (unit: nm) at 25° C. of the piezoelectric thin film device 112 in Example 1 was measured by the following method. As illustrated in FIG. 10, when an end of the piezoelectric thin film device 112 is fixed by a clamp 80 and voltage is applied between the first electrode layer 3 and the second electrode layer 7, an amount of displacement means the distance (amount of displacement Dis) through which the tip on an unfixed side of the piezoelectric thin film device 112 moves in a thickness direction (stacking direction, Z direction) of the piezoelectric thin film device 112 with the deformation of the piezoelectric thin film device 112. The frequency of alternating current voltage applied between the first electrode layer 3 and the second electrode layer 7 was 10 Hz. The alternating current voltage was 1.5 V±1.5 V, and had a sine wave form. While the alternating current voltage was applied, the temperature of the piezoelectric thin film device 112 was maintained at 25° C. The $Dis_{25°C.}$ in Example 1 was measured by using a laser Doppler vibrometer and an oscilloscope. The $Dis_{25°C.}$ in Example 1 is illustrated in Table 1.

The displacement characteristic of the piezoelectric thin film device 112 in Example 1 was evaluated by the following standard. The evaluation of the displacement characteristic in Example 1 is illustrated in Table 1. When the amount of displacement is 350 nm or more, it is considered that the amount of displacement is satisfactory practically, and however, a larger amount of displacement is preferable.

A: $Dis_{25°C.}$ is 550 nm or more.
B: $Dis_{25°C.}$ is 450 nm or more and less than 550 nm.
C: $Dis_{25°C.}$ is 350 nm or more and less than 450 nm.

[Calculation of Rate of Change of Amount of Displacement]

The rate of change ΔDis (unit: %) of the amount of displacement in Example 1 was calculated by the following method. The temperature of the piezoelectric thin film device 112 in Example 1 was changed in the range of 25 to 120° C., and the amounts of displacement of the piezoelectric thin film device 112 at respective temperatures were measured by the same method as the measuring method of $Dis_{25°C.}$ in Example 1. The maximum of amounts $Dis_{Max}$ (unit: nm) of displacement of the piezoelectric thin film device 112 at 25 to 120° C. was measured. ΔDis in Example 1 was calculated on the basis of expression B. The ΔDis in Example 1 is illustrated in Table 1.

$$\Delta Dis = (Dis_{Max} - Dis_{25°C.})/Dis_{25°C.} \times 100 \quad (B)$$

The temperature characteristic of the piezoelectric thin film device 112 in Example 1 was evaluated by the following standard. The evaluation of the temperature characteristic in Example 1 is illustrated in Table 1.

A: ΔDis is 20% or less.
B: ΔDis is more than 20%.

Examples 2 to 12

In the process of forming second intermediate layers 5 in Examples 2 to 12, sputtering targets having the composition illustrated in Table 1 respectively were used instead of the sputtering target used in the process of forming the second intermediate layer 5 in Example 1. Consequently, in Examples 2 to 12, second intermediate layers 5 having the same composition as the sputtering targets illustrated in Table 1 respectively were formed. Piezoelectric thin film devices 112 in Examples 2 to 12 were manufactured respectively by the same method as Example 1 except the above point.

The coefficients of linear expansion of the respective second intermediate layers 5 in Examples 2 to 12 were measured by the same method as Example 1. The coefficients of linear expansion of the respective second intermediate layers 5 in Examples 2 to 12 are illustrated in Table 1. Since the respective first electrode layers 3 in Examples 2 to 12 are the same as the first electrode layer 3 in Example 1, the coefficients of linear expansion of the respective first electrode layers 3 in Examples 2 to 12 are equal to the coefficient of linear expansion of the first electrode layer 3 in Example 1. Since the respective piezoelectric thin films 6 in Examples 2 to 12 are the same as the piezoelectric thin film 6 in Example 1, the coefficients of linear expansion of the respective piezoelectric thin films 6 in Examples 2 to 12 are equal to the coefficient of linear expansion of the piezoelectric thin film 6 in Example 1.

The measurement of respective amounts of displacement and the evaluation of respective displacement characteristics for Examples 2 to 12 were conducted by the same method as Example 1. The respective $Dis_{25°C}$'s and the evaluation of the respective displacement characteristics in Examples 2 to 12 are illustrated in Table 1.

The calculation of the rates of changes of the respective amounts of displacement and the evaluation of respective temperature characteristics for Examples 2 to 12 were conducted by the same method as Example 1. The respective ΔDis's and the evaluation of the respective temperature characteristics for Examples 2 to 12 are illustrated in Table 1.

Comparative Example 1

In Comparative Example 1, a first intermediate layer 4 and a second intermediate layer 5 were not formed. That is, in Comparative Example 1, a piezoelectric thin film 6 was formed directly on the surface of a first electrode layer 3. A piezoelectric thin film device in Comparative Example 1 was manufactured by the same method as Example 1 except the above point.

Since the first electrode layer 3 in Comparative Example 1 is the same as the first electrode layer 3 in Example 1, the coefficient of linear expansion of the first electrode layer 3 in Comparative Example 1 is equal to the coefficient of linear expansion of the first electrode layer 3 in Example 1. Since the piezoelectric thin film 6 in Comparative Example 1 is the same as the piezoelectric thin film 6 in Example 1, the coefficient of linear expansion of the piezoelectric thin film 6 in Comparative Example 1 is equal to the coefficient of linear expansion of the piezoelectric thin film 6 in Example 1.

The measurement of an amount of displacement and the evaluation of a displacement characteristic for Comparative Example 1 were conducted by the same method as Example 1. The $Dis_{25°C}$ and the evaluation of the displacement characteristic in Comparative Example 1 are illustrated in Table 1.

The calculation of the rate of change of the amount of displacement and the evaluation of a temperature characteristic for Comparative Example 1 were conducted by the same method as Example 1. The ΔDis and the evaluation of the temperature characteristic in Comparative Example 1 are illustrated in Table 1.

Comparative Example 2

A first intermediate layer 4 was not formed in Comparative Example 2. That is, in Comparative Example 2, a second intermediate layer 5 was formed directly on the surface of a first electrode layer 3. A piezoelectric thin film device in Comparative Example 2 was manufactured by the same method as Example 1 except the above point.

The coefficient of linear expansion of the second intermediate layer 5 in Comparative Example 2 was measured by the same method as Example 1. The coefficient of linear expansion of the second intermediate layer 5 in Comparative Example 2 is illustrated in Table 1. Since the first electrode layer 3 in Comparative Example 2 is the same as the first electrode layer 3 in Example 1, the coefficient of linear expansion of the first electrode layer 3 in Comparative Example 2 is equal to the coefficient of linear expansion of the first electrode layer 3 in Example 1. Since the piezoelectric thin film 6 in Comparative Example 2 is the same as the piezoelectric thin film 6 in Example 1, the coefficient of linear expansion of the piezoelectric thin film 6 in Comparative Example 2 is equal to the coefficient of linear expansion of the piezoelectric thin film 6 in Example 1.

The measurement of an amount of displacement and the evaluation of a displacement characteristic for Comparative Example 2 were conducted by the same method as Example 1. The $Dis_{25°C}$ and the evaluation of the displacement characteristic in Comparative Example 2 are illustrated in Table 1.

The calculation of the rate of change of the amount of displacement and the evaluation of a temperature characteristic for Comparative Example 2 were conducted by the same method as Example 1. The ΔDis and the evaluation of the temperature characteristic in Comparative Example 2 are illustrated in Table 1.

TABLE 1

| | First intermediate layer Sputtering target | Second intermediate layer Sputtering target | Second intermediate layer Coefficient of linear expansion (×10⁻⁶/K) | Amount of displacement $Dis_{25°C}$ (nm) | Displacement characteristic | Rate of change of amount of displacement ΔDis (%) | Temperature characteristic |
|---|---|---|---|---|---|---|---|
| Example 1 | $(K_{0.5}Na_{0.5})NbO_3$ | $SrRuO_3$ | 10.3 | 560 | A | 12 | A |
| Example 2 | $(K_{0.5}Na_{0.5})NbO_3$ | $SrTiO_3$ | 11.1 | 525 | B | 13 | A |
| Example 3 | $(K_{0.5}Na_{0.5})NbO_3$ | $LaNiO_3$ | 9.7 | 561 | A | 12 | A |
| Example 4 | $(K_{0.5}Na_{0.5})NbO_3$ | $CaRuO_3$ | 10.1 | 556 | A | 12 | A |
| Example 5 | $(K_{0.5}Na_{0.5})NbO_3$ | $BaRuO_3$ | 9.8 | 558 | A | 13 | A |
| Example 6 | $(K_{0.5}Na_{0.5})NbO_3$ | $La_{0.5}Sr_{0.5}CoO_3$ | 18.0 | 485 | B | 17 | A |
| Example 7 | $(K_{0.5}Na_{0.5})NbO_3$ | $La_4BaCu_5O_{13}$ | 17.8 | 485 | B | 17 | A |
| Example 8 | $(K_{0.5}Na_{0.5})NbO_3$ | $SrRu_{0.95}Mn_{0.05}O_3$ | 12.0 | 511 | B | 14 | A |
| Example 9 | $(K_{0.5}Na_{0.5})NbO_3$ | $YBa_2Cu_3O_7$ | 13.4 | 492 | B | 16 | A |
| Example 10 | $(K_{0.5}Na_{0.5})NbO_3$ | $LaAlO_3$ | 11.6 | 517 | B | 14 | A |
| Example 11 | $(K_{0.5}Na_{0.5})NbO_3$ | $YAlO_3$ | 11.7 | 518 | B | 14 | A |
| Example 12 | $(K_{0.5}Na_{0.5})NbO_3$ | $LaSrMnO_3$ | 11.0 | 522 | B | 13 | A |
| Comparative Example 1 | — | — | — | 409 | C | 28 | B |
| Comparative Example 2 | — | $SrRuO_3$ | 10.3 | 447 | C | 18 | A |

As illustrated in Table 1, the amount of displacement of the piezoelectric thin film device in Comparative Example 2 that comprises the second intermediate layer 5 was larger than that of the piezoelectric thin film device in Comparative Example 1 that does not comprise the first intermediate layer 4 and the second intermediate layer 5. The rate of change of the amount of displacement in Comparative Example 2 was lower than the rate of change of the amount of displacement in Comparative Example 1. The amount of displacement of the piezoelectric thin film device in Example 1 that comprises the first intermediate layer 4 and the second intermediate layer 5 was larger than that of the piezoelectric thin film device in Comparative example 2 that does not comprise the first intermediate layer 4. The rate of change of the amount of displacement in Example 1 was lower than the rate of change of the amount of displacement in Comparative Example 2.

The present inventors consider that a mechanism in which the amounts of displacement in the Examples become large and the rates of changes of the amounts of displacement in the Examples decrease is as follows. Since the coefficient of linear expansion of the second intermediate layer 5 is higher than the respective coefficients of linear expansion of the first electrode layer 3 and the piezoelectric thin film 6, stress in a compression direction occurs in the piezoelectric thin film 6. Consequently, since the orientation axis in a thickness direction (Z direction) of the piezoelectric thin film 6 is stabilized, the rate of change of the amount of displacement decreases, and the amount of displacement also becomes large. However, when there is only the second intermediate layer 5, improvement in the amount of displacement is not enough. However, since the first intermediate layer 4 including K, Na, and Nb similarly to the piezoelectric thin film 6 is provided, influence due to the difference between the second intermediate layer 5 and the piezoelectric thin film 6 in the crystal structure or the crystal orientation is reduced. Consequently, the amount of displacement becomes still larger, and the rate of change of the amount of displacement further decreases.

As illustrated in Table 1, even though the second intermediate layer 5 in Example 1 was changed into the respective second intermediate layers 5 in Examples 2 to 12, the piezoelectric thin film devices in the Examples were superior in the displacement characteristic and the temperature characteristic to the piezoelectric thin film devices in the Comparative Examples.

As illustrated in Table 1, the piezoelectric thin film devices in Examples 1 to 12, the second intermediate layers 5 of which consist of inorganic oxides, were excellent in the displacement characteristic and the temperature characteristic. The piezoelectric thin film devices in Examples 1 and 3 to 5, the second intermediate layers 5 of which consist of $SrRuO_3$, $CaRuO_3$, $BaRuO_3$, or $LaNiO_3$, were superior in the displacement characteristic to the piezoelectric thin film devices in Examples 2 and 6 to 12.

INDUSTRIAL APPLICABILITY

The present invention provides a piezoelectric thin film-stacked body the amounts of displacement of which are large and unlikely to depend on temperature, a piezoelectric thin film substrate, and a piezoelectric thin film device as well as a piezoelectric actuator using the piezoelectric thin film device, a piezoelectric sensor, a head assembly, a head stack assembly, a hard disk drive, a printer head, and an ink-jet printer device.

REFERENCE SIGNS LIST

100: piezoelectric thin film-stacked body; 101: piezoelectric thin film substrate; 102 and 103: piezoelectric thin film devices; 1: substrate; 2: insulating layer; 3: first electrode layer; 4, 4a, and 4b: first intermediate layer; 5, 5a, and 5b: second intermediate layer; 6: piezoelectric thin film; 7: second electrode layer; 200: head assembly; 9: base plate; 11: load beam; 11b: base end; 11c: first flat spring portion; 11d: second flat spring portion; 11e: opening portion; 11f: beam main portion; 13: piezoelectric thin film device; 15: flexible substrate; 17: flexure; 19: slider; 19a: head device; 300: piezoelectric actuator; 20: base; 21: pressure chamber; 23: insulating film; 24: lower electrode layer (first electrode layer); 25: piezoelectric thin film; 26: upper electrode layer (second electrode layer); 27: nozzle; 28: first intermediate layer; 29: second intermediate layer; 400: gyro sensor; 110: basal portion; 120 and 130: arms; 30: piezoelectric thin film; 31: upper electrode layer (second electrode layer); 31a and 31b: driving electrode layers; 31c and 31d: sensing electrode layers; 32: lower electrode layer (first electrode layer); 33: first intermediate layer; 34: second intermediate layer; 500: pressure sensor; 40: piezoelectric thin film device; 41: support; 42: cavity; 43: common electrode layer (first electrode layer); 44: first intermediate layer; 45: second intermediate layer; 46: piezoelectric thin film; 47: individual electrode layer (second electrode layer); 48: current amplifier; 49: voltage-measuring device; 600: pulse wave sensor; 50: piezoelectric thin film device; 51: support; 52: insulating layer; 53: common electrode layer (first electrode layer); 54: first intermediate layer; 55: second intermediate layer; 56: piezoelectric thin film; 57: individual electrode layer (second electrode layer); 58: voltage-measuring device; 700: hard disk drive; 60: case; 61: hard disk; 62: head stack assembly; 63: voice coil motor; 64: actuator arm; 65: head assembly; 800: ink-jet printer device; 70: printer head; 71: main body; 72: tray; 73: head drive mechanism; 74: output opening; 75: recording paper; 76: automatic sheet feeder (automatic continuous paper feed mechanism); 111: piezoelectric thin film substrate; 112: piezoelectric thin film device; 80: clamp.

What is claimed is:

1. A piezoelectric thin film-stacked body, comprising:
   a first electrode layer;
   a first intermediate layer stacked on the first electrode layer;
   a second intermediate layer stacked on the first intermediate layer; and
   a piezoelectric thin film stacked on the second intermediate layer,
   wherein the first intermediate layer includes K, Na and Nb,
   the second intermediate layer is a layer causing stress in a compression direction in the piezoelectric thin film, and
   the piezoelectric thin film includes $(K,Na)NbO_3$.

2. The piezoelectric thin film-stacked body according to claim 1, wherein the second intermediate layer includes an inorganic oxide.

3. The piezoelectric thin film-stacked body according to claim 1, wherein the second intermediate layer includes a perovskite-type inorganic oxide.

4. The piezoelectric thin film-stacked body according to claim 1,
   wherein the second intermediate layer includes at least one perovskite-type inorganic oxide selected from the group consisting of $SrRuO_3$, $CaRuO_3$, $BaRuO_3$, and $LaNiO_3$.

5. A piezoelectric thin film substrate, including:
   the piezoelectric thin film-stacked body according to claim 1; and
   a substrate,
   wherein the first electrode layer is located between the substrate and the first intermediate layer.

6. A piezoelectric thin film device, including:
   the piezoelectric thin film-stacked body according to claim 1; and
   a second electrode layer, wherein the first intermediate layer, the second intermediate layer, and the piezoelectric thin film are located between the first electrode layer and the second electrode layer.

7. A piezoelectric actuator, comprising:
the piezoelectric thin film device according to claim 6.

8. A piezoelectric sensor, comprising:
the piezoelectric thin film device according to claim 6.

9. A head assembly, comprising:
the piezoelectric actuator according to claim 7.

10. A head stack assembly, comprising:
the head assembly according to claim 9.

11. A hard disk drive, comprising:
the head stack assembly according to claim 10.

12. A printer head, comprising:
the piezoelectric actuator according to claim 7.

13. An ink-jet printer device, comprising:
the printer head according to claim 12.

14. The piezoelectric thin film-stacked body according to claim 1,
wherein the coefficient of linear expansion of the second intermediate layer is higher than the coefficient of linear expansion of the first electrode layer, and the coefficient of linear expansion of the second intermediate layer is higher than the coefficient of linear expansion of the piezoelectric thin film.

15. The piezoelectric thin film-stacked body according to claim 1,
wherein the coefficient of linear expansion of the second intermediate layer is $0.1 \times 10^{-6}$ (1/K) or more higher than the larger value of the coefficient of linear expansion of the first electrode layer and the coefficient of linear expansion of the piezoelectric thin film.

16. The piezoelectric thin film-stacked body according to claim 1,
wherein the coefficient of linear expansion of the second intermediate layer is $8.0 \times 10^{-6}$ to $20.0 \times 10^{-6}$ (1/K), and the coefficient of linear expansion of the first electrode layer is $3.0 \times 10^{-6}$ to $15.0 \times 10^{-6}$ (1/K), and the coefficient of linear expansion of the piezoelectric thin film is $3.0 \times 10^{-6}$ to $11.0 \times 10^{-6}$ (1/K).

* * * * *